(12) United States Patent
Ho et al.

(10) Patent No.: US 6,426,660 B1
(45) Date of Patent: Jul. 30, 2002

(54) DUTY-CYCLE CORRECTION CIRCUIT

(75) Inventors: Shiu C. Ho; David W. Blum, both of Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/943,665

(22) Filed: Aug. 30, 2001

(51) Int. Cl.[7] .................. H03K 3/017; H03K 21/00; H03B 19/00
(52) U.S. Cl. .................. 327/175; 327/115; 327/116
(58) Field of Search ............... 327/115, 116, 327/117, 119, 122, 175, 176; 377/47, 48

(56) References Cited

U.S. PATENT DOCUMENTS

| | | | |
|---|---|---|---|
| 4,527,075 A | 7/1985 | Zbinden | 327/175 |
| 4,642,490 A * | 2/1987 | Lawton | 327/116 |
| 5,103,114 A | 4/1992 | Fitch | 327/175 |
| 5,315,164 A | 5/1994 | Broughton | 327/175 |
| 5,757,218 A | 5/1998 | Blum | 327/175 |
| 5,912,574 A | 6/1999 | Bhagwan | 327/157 |
| 5,923,621 A | 7/1999 | Kanekal et al. | 368/117 |
| 5,942,947 A | 8/1999 | Bhagwan | 331/8 |
| 5,945,862 A | 8/1999 | Donnelly et al. | 327/278 |
| 5,945,881 A * | 8/1999 | Lakshmikumar | 327/107 |
| 5,955,902 A * | 9/1999 | Takada et al. | 327/113 |
| 5,963,071 A | 10/1999 | Dowlatabadi | 327/175 |
| 6,060,922 A | 5/2000 | Chow et al. | 327/175 |
| 6,100,736 A * | 8/2000 | Wu et al. | 327/116 |
| 6,295,328 B1 * | 9/2001 | Kim et al. | 327/116 |

* cited by examiner

Primary Examiner—My-Trang Nu Ton
(74) Attorney, Agent, or Firm—Whitham, Curtis & Christofferson, P.C.; Richard A. Henkler

(57) ABSTRACT

A duty-cycle correction circuit corrects a clock with arbitrary duty-cycle to a 50% duty-cycle clock, with its original frequency. The device acts to translate a non-50% duty-cycle clock to an accurate 50% duty-cycle clock by utilizing a divide-by-2 frequency divider and a multiply-by-2 clock doubler to achieve conversion. The duty-cycle correction circuit increases the translation back to its original frequency while using an analog negative feedback to maintain an accurate 50% duty cycle.

6 Claims, 6 Drawing Sheets

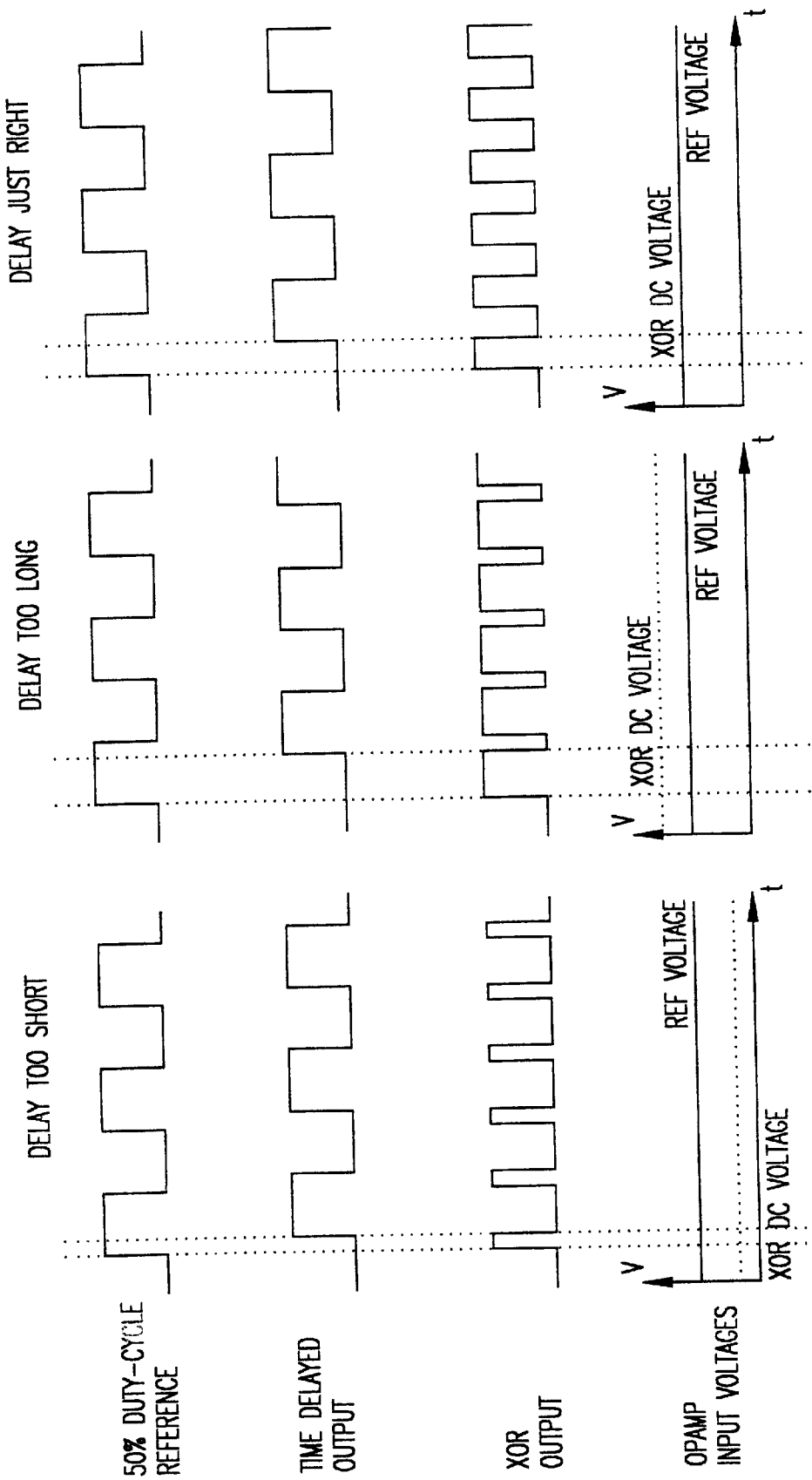

DUTY-CYCLE CORRECTION CIRCUIT

BACKGROUND OF THE INVENTION

1. Field of the Invention

The present invention generally relates to clock signals used for timing and synchronization of digital data processing devices and systems and, more particularly, to clock signal duty-cycle correction.

2. Background Description

As many clock driven digital systems are required to perform at higher and higher speeds, designers are investigating different options to achieve this high speed operation. Designers may decide to use both the rising and the falling edge of a given clock signal to double the total number of operations. However, this requires a clock to output accurate 50% duty-cycle to prevent or reduce jitters and other timing related aberrations.

At relatively low frequencies of clock signals, one method to provide a desired symmetrical clock signal uses a conventional flip-flop circuit to perform an equivalent division-by-two for deriving an output clock signal frequency. The source clock frequency must be two times faster than the desired circuit design operating frequency for this method. However, as frequencies increase, the source clock frequency will reach the technology limitation before reaching the circuit design operating frequency. Conventional methods or topologies that have been proposed do not generate a very accurate multiply-by-2 output frequency because some of these methods use a digital controller to select a fixed number of delays. In the case of varying duty-cycles, using a fixed number of delays is not effective to generate accurate multiply-by-2 output frequencies.

SUMMARY OF THE INVENTION

It is therefore an object of the present invention to provide a duty-cycle correction circuit capable of correcting a clock with arbitrary duty-cycle to a 50% duty-cycle clock, with its original frequency maintained. Another object of the invention is to provide a method of translating a non-50% duty-cycle clock to an accurate 50% duty-cycle clock. Another, more particular object of the invention is to provide a duty-cycle correction circuit for correcting a clock with arbitrary duty-cycle to a 50% duty-cycle clock that is simple and cost efficient.

According to the invention, the duty-cycle correction circuit includes a divide-by-2 frequency divider and a multiply-by-2 clock doubler connected to the frequency divider. The present invention utilizes negative feedback, a reference 50% duty-cycle clock signal, and a current controlled delay block to maintain an accurate multiply-by-2 output frequency with 50% duty-cycle. A non-50% duty-cycle input clock signal is translated to an accurate 50% duty-cycle clock signal by converting a non-50% duty-cycle input clock signal having an input frequency to a 50% duty-cycle reference signal having a frequency of half the input frequency. The frequency of the 50% duty-cycle reference source signal is then converted to the input frequency while using an analog negative feedback to maintain a 50% duty-cycle.

In a preferred embodiment, the duty-cycle correction circuit translates the non50% duty-cycle clock signal to an accurate 50% duty-cycle clock using the divide-by-2 frequency divider and multiply-by-2 clock doubler. The divide-by-2 frequency divider converts the non-50% duty cycle input clock signal to the 50% duty-cycle reference signal having half of the original frequency. Then, the multiply-by-2 clock doubler converts this 50% duty-cycle reference signal back to the frequency of the inputted clock signal while using an analog negative feedback to maintain an accurate 50% duty-cycle. In this case, the source clock frequency and the design operating frequency are identical and can be pushed towards the technology limit.

BRIEF DESCRIPTION OF THE DRAWINGS

The foregoing and other objects, aspects and advantages will be better understood from the following detailed description of a preferred embodiment of the invention with reference to the drawings, in which:

FIGS. 5A, 5B and 5C are timing diagrams illustrating a feedback mechanism in accordance with the present invention;

DETAILED DESCRIPTION OF A PREFERRED EMBODIMENT OF THE INVENTION

The present invention is a duty-cycle correction circuit capable of correcting a clock with arbitrary duty-cycle to a 50% duty-cycle clock, with its original frequency maintained. The present invention provides a method of translating a non-50% duty-cycle clock to an accurate 50% duty-cycle clock. Additionally, the present invention provides a duty-cycle correction circuit for correcting a clock with arbitrary duty-cycle to a 50% duty-cycle clock that is simple and cost efficient.

Figure 1:
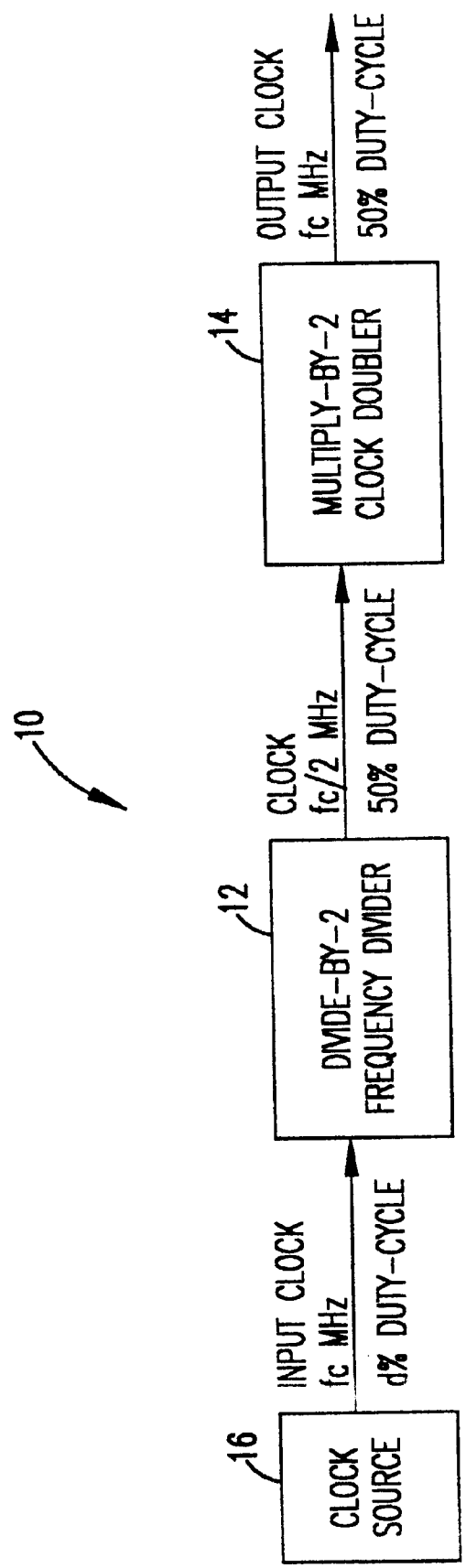
FIG. 1 is a simplified block diagram of a duty-cycle correction circuit in accordance with the present invention.

Referring now to the drawings, and more particularly to FIG. 1, there is a simplified block diagram of a duty-cycle correction circuit, shown generally at 10, in accordance with the present invention. The correction circuit 10 includes a divide-by-2 frequency divider 12 connected to a multiply-by-2 clock doubler 14. The frequency divider 12 receives an input clock signal, or reference clock, having an input frequency, $f_c$, and some duty-cycle which may be greater or lesser than 50% that is generated by a clock source 16. The output of the frequency divider 12 is a frequency divided clock signal having a reference frequency, $f_c/2$, and a 50% duty-cycle.

Figure 2:
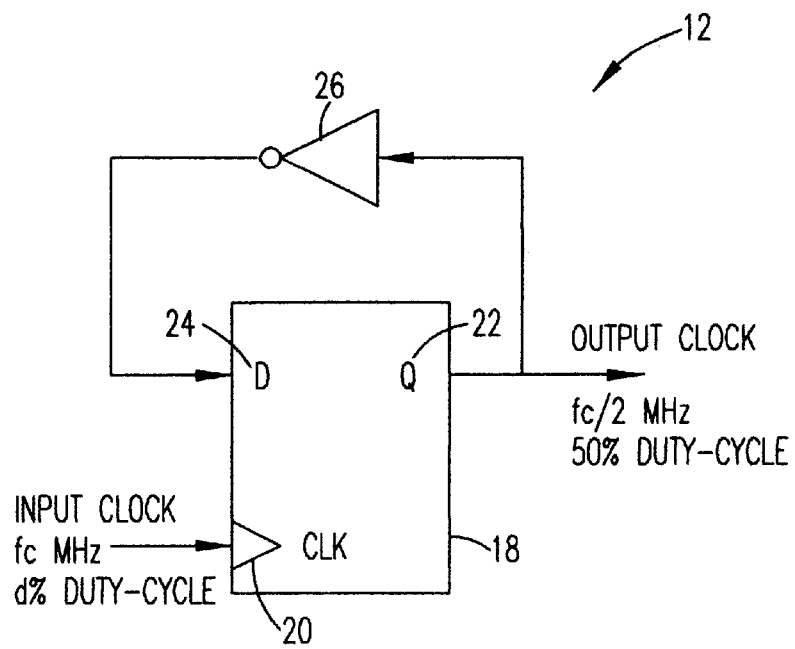
FIG. 2 is a circuit diagram of a divide-by-2 frequency divider.

FIG. 2 is a circuit diagram illustrating a preferred embodiment of how the divide-by-2 frequency divider 12 can be implemented according to the teachings of the present invention. In the preferred embodiment, the divide-by-2 frequency divider 12 is implemented as a D-type flip-flop 18 having a clock signal input 20, a data output 22, a data input 24, and an inverter 26 interconnecting the data output 22 with the data input 24. The clock signal input 20 receives the reference clock having frequency $f_c$ and triggers on the rising edge of the clock. The inverted output is fed back to the data input 24 maintaining the state of the flip-flop until the next clock pulse. With this operation, the duty-cycle information on the reference clock is ignored. Since the D-type flip-flop only triggers on the rising edge of the reference clock, the output frequency of the flip-flop 18 is half that of the frequency of the input clock. The output of the frequency divider 12 is the frequency divided clock signal with frequency,$f_c/2$, and a 50% duty-cycle, as previously mentioned.

Figure 3:
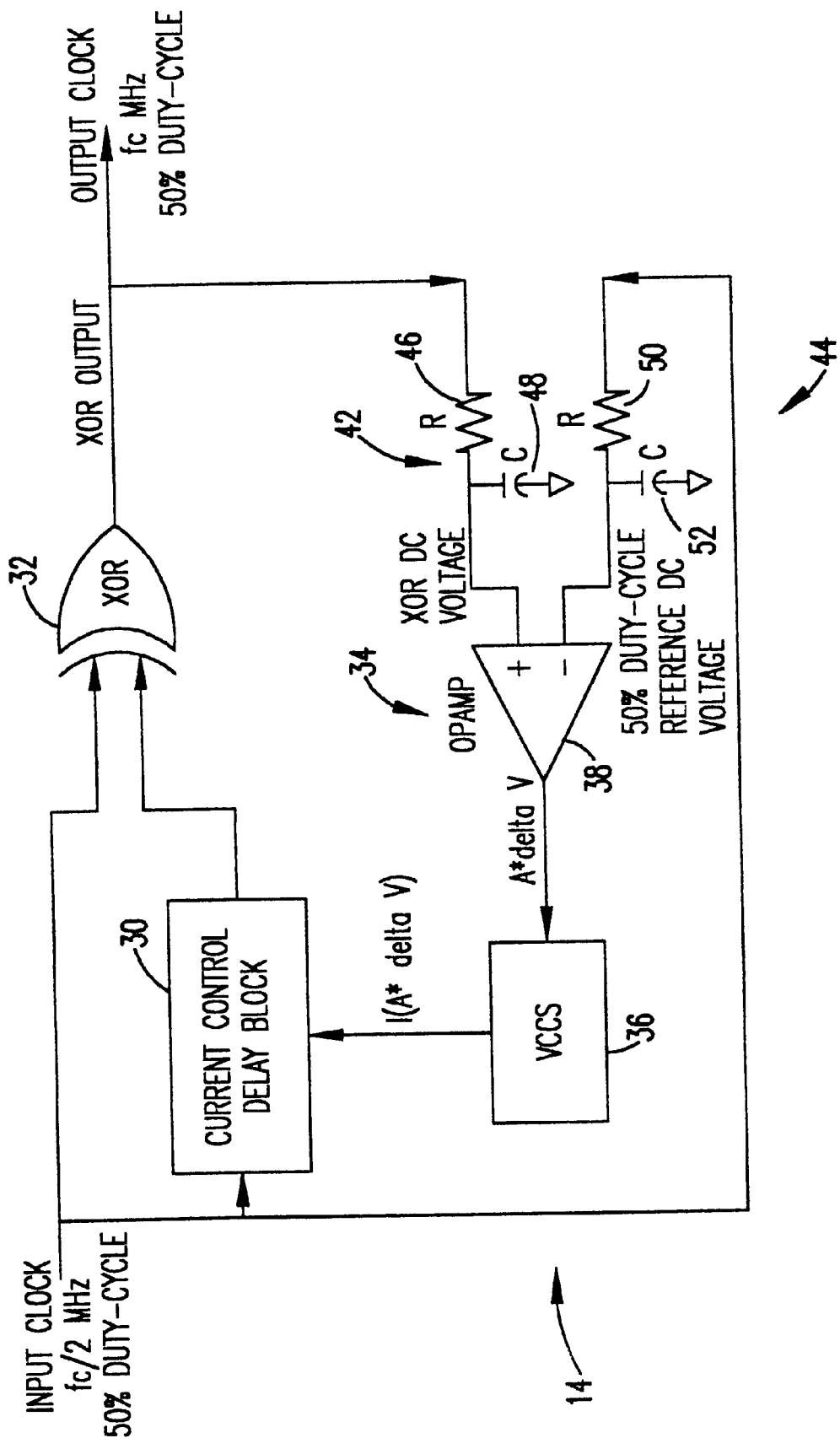
FIG. 3 is a schematic diagram of a current controlled delay block.

FIG. 3 is a circuit diagram illustrating a preferred embodiment for implementing the multiply-by-2 clock doubler 14 according to the teachings of the present invention. The frequency divided clock signal having frequency, $f_c/2$, and 50% duty-cycle, is fed into the multiply-by-2 clock doubler 14. The clock doubler 14 includes a current controlled delay block 30, an analog comparator 34, two low pass filters 42 and 44, and a voltage control current source (VCCS) 36.

The current controlled delay block 30 receives the frequency divided clock signal having frequency, $f_c/2$, and 50% duty-cycle from the frequency divider 12 and outputs a time delayed clock signal to the phase detector 32. The frequency divided clock signal is delayed by a time delay controlled by an external current source, which is the VCCS 36. In a preferred embodiment, the amount of delay of the outputted time delayed clock signal is dependent on the amount of current that is fed back to the current controlled delay block 30.

The phase detector 32 compares the time delayed clock signal from the current controlled delay block 30 with the frequency divided clock signal having a frequency, $f_c/2$, and 50% duty-cycle from the frequency divider 12, and outputs a duty-cycle corrected signal. When the negative feedback control has reached convergence (42, 44, 36 and 30), the XOR logic output is the duty-cycle corrected signal having frequency, $f_c$, and 50% duty cycle.

The low pass filter circuits 42 and 44 perform an integrating function and are implemented using resistor-capacitor (RC) networks. For example, the filter circuit 44 and the filter circuit 42 each include a resistor 46, 50, respectively that is connected at one end to a capacitor 48, 52, respectively and the capacitor is in turn connected to ground. The filter circuits 42 and 44 each have a time constant that is preferably the same time constant.

The comparator 34 is an operational amplifier (OP AMP) 38 that has inputs connected to low pass filter circuits 42 and 44. The filter circuit 44 receives the frequency divided clock signal from the frequency divider 12 and outputs a reference d.c. voltage, and the filter circuit 42 receives the duty-cycle corrected signal from the first phase detector 32 and outputs a corrected d.c. voltage. The OP AMP 34 compares the reference d.c. voltage with the corrected d.c. voltage and outputs a voltage difference (A* delta V). The OP AMP 38 in combination with the low pass filters 42 and 44 operate as a negative feedback.

The VCCS 36 is an external current source that receives the voltage difference from the OP AMP 38 and generates a d.c. current based on the voltage difference. The d.c. current is fed back to the current controlled delay block 30 to regulate the time delay of the time delayed clock signal and, ultimately, the duty-cycle of the duty-cycle corrected signal.

Figure 4:
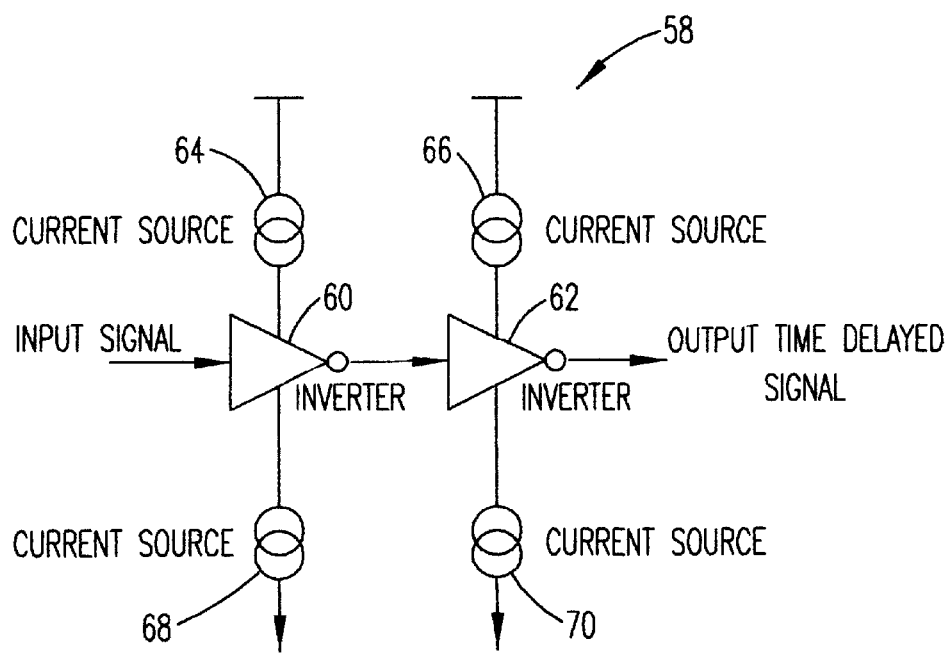
FIG. 4 is a circuit diagram of a multiply-by-2 clock doubler.

FIG. 4 is a schematic diagram of a preferred embodiment illustrating an implementation of the current controlled delay block 30 of FIG. 2, according to the teachings of the present invention. The delay block 30 includes a pair of invertors 60, 62 that are connected in series for receiving the frequency divided clock signal and outputting a time delayed clock signal. Each of the inverters includes two external current sources 64, 66, 68, 70, respectively. When the duty-cycle of duty-cycle corrected signal from the phase detector 32 is less than 50%, less current will be fed back to increase time delay of the time delayed clock signal from the current controlled delay block 30. When the duty-cycle of duty-cycle corrected signal from the phase detector 32 is more than 50%, more current will be fed back to decrease the time delay of the time delayed clock signal from the current controlled delay block 30.

FIGS. 5A, 5B and 5C are timing diagrams illustrating the operation of the feedback mechanism of the present invention where the wave forms illustrated correspond with the time delayed output from the current controlled delay block 30 shown in FIG. 3, the XOR output from the phase detector 32 shown in FIG. 3, and the input voltages for the OP AMP 38 shown in FIG. 3. In accordance with the present invention, the duty-cycle correction circuit 10 reaches convergence when the XOR d.c. voltage is close to the 50% reference d.c. voltage; that is, the XOR output has reached a 50% duty-cycle point. When the time delayed clock signal from the current controlled delay block 30 is too strong, as best shown in FIG. 5A, the VCCS 36 reduces control current to increase time delay of the time delayed clock signal. When the time delayed clock signal from the current controlled delay block 30 is too weak, as best shown in FIG. 5B, the VCCS 36 increases control current to reduce the time delay of the time delayed clock signal. When the time delayed clock signal is correct, as best shown in FIG. 5C, the VCCS 36 reaches convergence, resulting in an output signal with a 50% duty-cycle.

Figure 6:
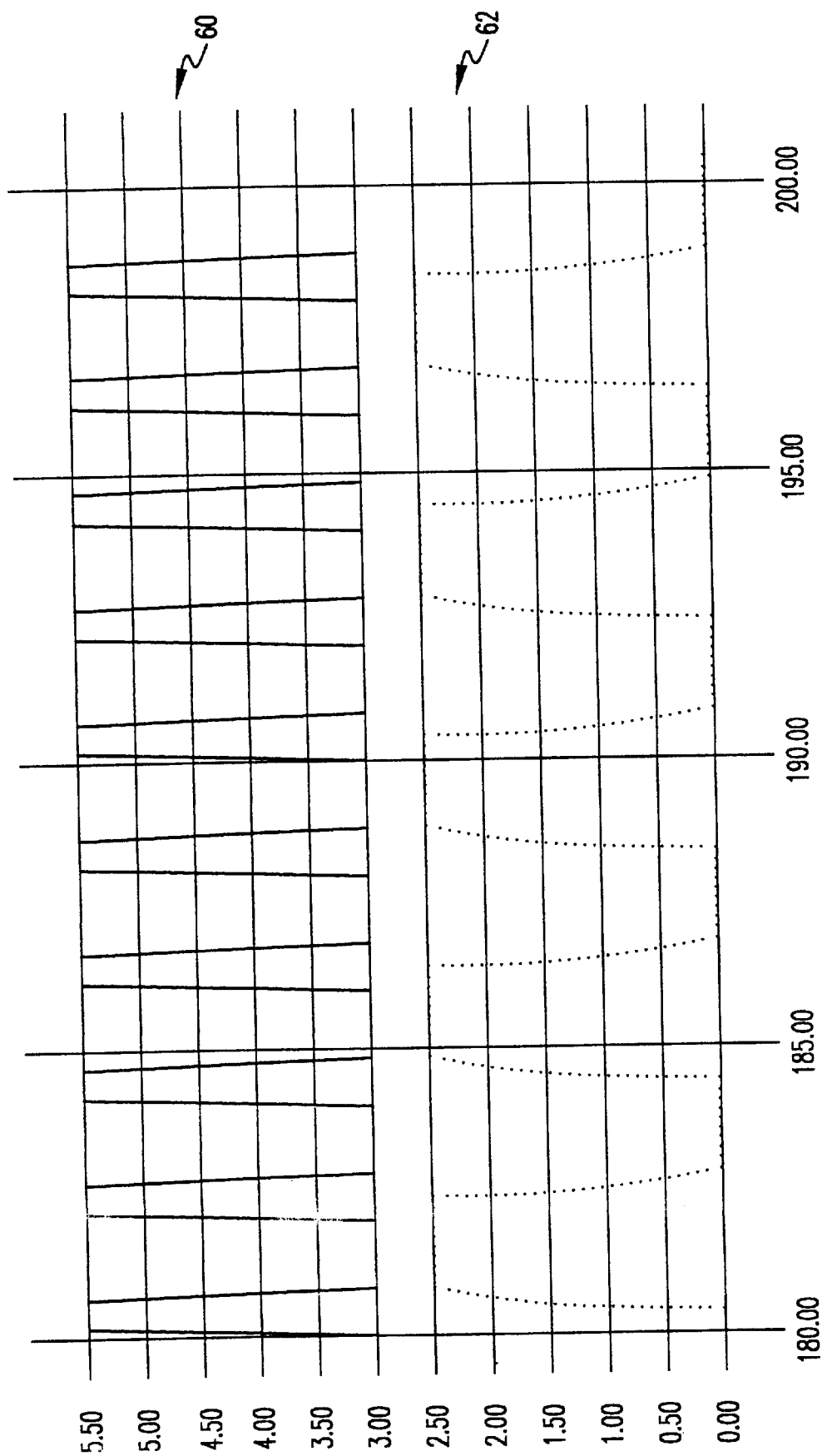
FIG. 6 is a plot illustrating the input and the output waveforms of the divide-by-2 frequency divider in accordance with the present invention.

FIG. 6 is a plot illustrating an input waveform 60 and an output waveform 62 of the divide-by-2 frequency divider 12 in accordance with the present invention. The input waveform 60 has a non-50% duty cycle, and in the example illustrated, less than a 50% duty cycle. After the input waveform 60 passes through the divide-by-2 frequency divider 12, the output waveform 62 has a frequency of half the frequency of the input waveform 60 and a 50% duty cycle.

Figure 7:
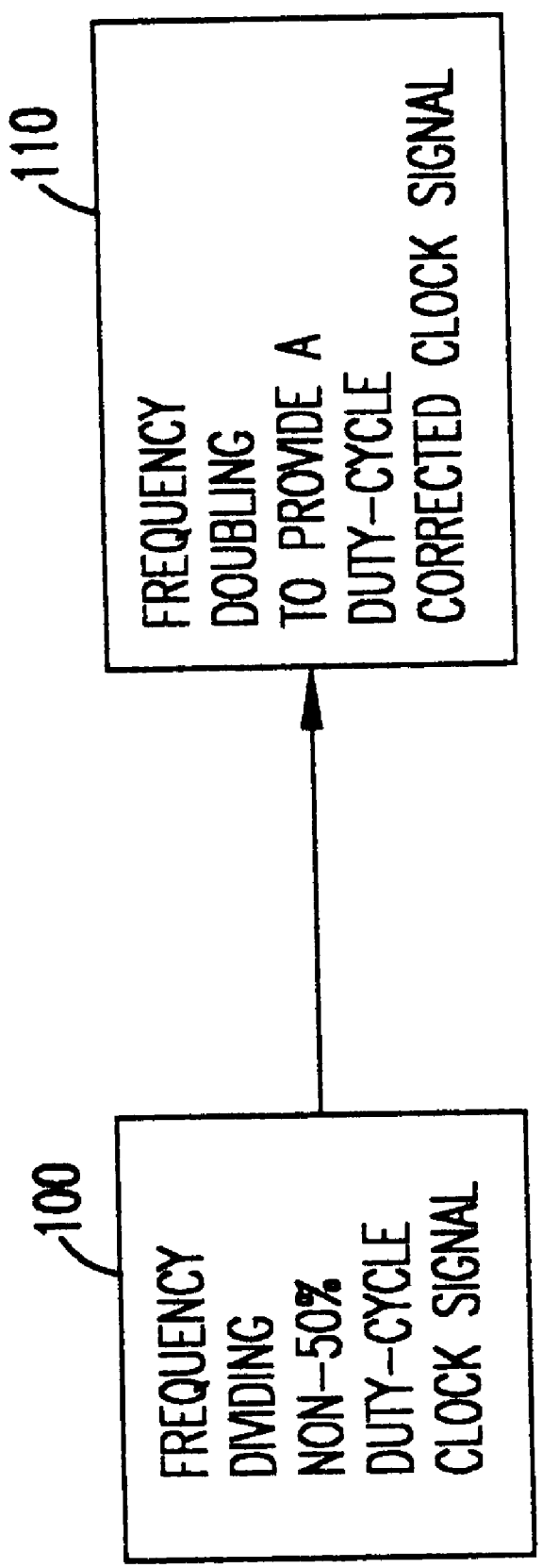
FIG. 7 is a flow chart illustrating a method for translating a non-50% duty cycle clock signal to an accurate 50% duty cycle clock signal.

The method of translating a non-50% duty-cycle clock signal to an accurate 50% duty-cycle clock signal is illustrated in FIG. 7. In block 100, a non-50% duty-cycle input clock signal having a frequency $f_c$ is converted to a 50% duty-cycle frequency divided clock signal having a frequency of half the input frequency $f_c/2$. When converting the non-50% duty-cycle clock signal, the inputted clock signal is frequency divided-by-two with a D-type flip flop. The frequency divided clock signal is then converted by frequency doubling in block 110 to a duty-cycle corrected clock signal having the input frequency of the input clock signal while using an analog negative feedback to maintain a 50% duty-cycle of the duty-cycle corrected clock signal. When converting the frequency divided clock signal $f_c/2$ to the duty-cycle corrected clock signal, a current controlled time delayed signal is compared to the 50% duty-cycle frequency divided clock signal with XOR logic to produce a duty-cycle corrected clock signal. Then, a d.c. voltage proportional to the duty-cycle corrected clock signal is compared to a d.c. voltage proportional to the 50% duty cycle input clock signal to produce a feedback signal. When comparing the duty-cycle corrected clock signal with the input clock signal, the time delay of the current controlled time delayed signal is increased when the duty-cycle of the duty-cycle corrected output is less than 50% and decreased when the duty-cycle of the duty-cycle corrected output is greater than 50%.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A duty-cycle correction circuit providing an accurate 50% duty cycle clock signal from an input clock signal having a frequency $f_c$ and a non-50% duty cycle, said circuit comprising:

a divide-by-two frequency divider receiving the input clock signal and outputting a signal having a frequency $f_c/2$ with a 50% duty cycle;

a current controlled delay block receiving the output signal from the divide-by-two frequency divider and outputting a signal having a frequency $f_c/2$ with a 50% duty cycle delayed by a time proportional to a current control signal;

an exclusive OR gate receiving the output signals of the divide-by-two frequency divider and the current controlled delay block and outputting a signal having a frequency $f_c$ and a 50% duty cycle;

a first low pass filter receiving the output signal of the exclusive OR gate and producing a first d.c. voltage signal;

a second low pass filter receiving the output signal from the divide-by-two frequency divider and outputting a second d.c. voltage signal;

an operational amplifier receiving the first and second d.c. voltages and outputting a voltage signal proportional to a difference between the first and second d.c. voltages; and a voltage controlled current source responsive to the output voltage signal of the operational amplifier for generating the current control signal to the current controlled delay block.

2. A duty-cycle correction circuit according to claim 1, wherein said frequency divider includes a D-type flip-flop.

3. A duty-cycle correction circuit according to claim 2, wherein said flip-flop includes a clock input, a data input, a data output, further including an inverter connecting said data output with said data input.

4. A duty-cycle correction circuit according to claim 1, wherein said low pass filters each include a resistor connected to a capacitor.

5. A duty-cycle correction circuit according to claim 1, wherein said current controlled delay block comprises:

at least one invertor receiving an input signal and outputting a time delayed signal; and at least one external current source connected to said at least one invertor.

6. A method of translating a non-50% duty cycle clock signal having a frequency $f_c$ to an accurate 50% duty cycle clock signal, said method comprising the steps of:

dividing the input clock signal by two and outputting a signal having a frequency $f_c/2$ with a 50% duty cycle;

delaying the signal having a frequency $f_c/2$ with a 50% duty cycle by a time proportional to a current control signal;

performing an exclusive OR function on the signal having a frequency $f_c/2$ with a 50% duty cycle the delayed signal having a frequency $f_c/2$ with a 50% duty and outputting a signal having a frequency $f_c$ and a 50% duty cycle;

low pass filtering an output signal of the exclusive OR function to produce a first d.c. voltage;

low pass filtering the signal having a frequency $f_c/2$ with a 50% duty cycle to produce a second d.c. voltage;

comparing the first and second d.c. voltages to produce a voltage signal proportional to a difference between the first and second d.c. voltages; and generating the current control signal as a function of the voltage signal proportional to a difference between the first and second d.c. voltages, the current control signal controlling the delay of the signal having a frequency $f_c/2$ with a 50% duty cycle.

* * * * *